(12) United States Patent
Schmitz et al.

(10) Patent No.: US 11,232,918 B2
(45) Date of Patent: Jan. 25, 2022

(54) SWITCHING DEVICE FOR CONDUCTING AND INTERRUPTING ELECTRICAL CURRENTS

(71) Applicant: EATON INTELLIGENT POWER LIMITED, Dublin (IE)

(72) Inventors: Gerd Schmitz, Niederkassel (DE); Johannes Meissner, Bonn (DE); Marcel Uedelhoven, Blankenheim (DE); Michael Wohlang, Bornheim (DE); Oliver Kreft, Bonn (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 529 days.

(21) Appl. No.: 16/091,110

(22) PCT Filed: Mar. 16, 2017

(86) PCT No.: PCT/EP2017/056312
§ 371 (c)(1),
(2) Date: Oct. 4, 2018

(87) PCT Pub. No.: WO2017/174326
PCT Pub. Date: Oct. 12, 2017

(65) Prior Publication Data
US 2020/0328038 A1    Oct. 15, 2020

(30) Foreign Application Priority Data

Apr. 7, 2016   (DE) .................. 10 2016 106 415.7

(51) Int. Cl.
*H01H 9/54*      (2006.01)
*H01H 33/04*     (2006.01)
(Continued)

(52) U.S. Cl.
CPC ............ *H01H 9/542* (2013.01); *H01H 9/547* (2013.01); *H01H 33/04* (2013.01);
(Continued)

(58) Field of Classification Search
CPC .......... H01H 9/542; H01H 9/547; H01H 9/42; H01H 9/56; H01H 2009/544;
(Continued)

(56) References Cited

U.S. PATENT DOCUMENTS 3,639,808 A   2/1972 Ritzow
8,742,828 B2  6/2014 Naumann et al.
(Continued)

FOREIGN PATENT DOCUMENTS

CN     102349124 A   2/2012
DE       4244116 C1   3/1994
(Continued)

*Primary Examiner* — Bryan R Perez
(74) *Attorney, Agent, or Firm* — Leydig, Voit & Mayer, Ltd.

(57) ABSTRACT

A switching apparatus for conducting and interrupting electrical currents includes: a first mechanical contact arrangement; a semiconductor switch which is connected in parallel to the first mechanical contact arrangement; a second mechanical contact arrangement connected in series to the first mechanical contact arrangement; an auxiliary coil electrically isolated from a circuit of a switching drive used to move contacts of the first and second mechanical contact arrangements, and which is electromagnetically coupled to a coil of the switching drive such that a voltage is generated therein when a voltage supply of the switching drive is switched off; and a switching electronics for switching the semiconductor switch on and off, and which is supplied with the voltage generated in the auxiliary coil when the voltage supply of the switching drive is switched off. The switching
(Continued)

electronics switches the semiconductor switch on and off multiple times according to a prespecified sequence.

10 Claims, 3 Drawing Sheets

(51) Int. Cl.
    *H01H 33/59*     (2006.01)
    *H01H 33/66*     (2006.01)
    *H03K 17/56*     (2006.01)

(52) U.S. Cl.
    CPC .......... *H01H 33/596* (2013.01); *H01H 33/66* (2013.01); *H03K 17/56* (2013.01); *H01H 2009/544* (2013.01)

(58) Field of Classification Search
    CPC ....... H01H 2009/546; H01H 2009/543; H01H 89/00; H01H 2033/66215; H01H 2033/66223; H01H 2235/01; H01H 33/14; H01H 33/596; H01H 33/66207; H01H 33/66238; H01H 33/664; H01H 33/6647; H01H 33/666; H01H 33/04
    See application file for complete search history.

(56) References Cited

U.S. PATENT DOCUMENTS

| | | | |
|---|---|---|---|
| 9,741,513 B2 | 8/2017 | Gerd et al. | |
| 10,498,331 B2* | 12/2019 | Schmitz | H01H 33/04 |
| 2009/0168273 A1* | 7/2009 | Yu | H01H 9/542 |
| | | | 361/13 |
| 2010/0083926 A1* | 4/2010 | Okumoto | H02P 1/10 |
| | | | 123/179.4 |
| 2010/0232082 A1 | 9/2010 | Seger | |
| 2012/0007657 A1* | 1/2012 | Naumann | H01H 9/542 |
| | | | 327/434 |
| 2014/0332500 A1 | 11/2014 | Davide et al. | |
| 2016/0322184 A1 | 11/2016 | Gerd et al. | |

FOREIGN PATENT DOCUMENTS

| | | |
|---|---|---|
| DE | 10225259 B3 | 1/2004 |
| DE | 102013114259 A1 | 6/2015 |
| DE | 102013114260 A1 | 6/2015 |
| EP | 1677323 A1 | 7/2006 |

\* cited by examiner

SWITCHING DEVICE FOR CONDUCTING AND INTERRUPTING ELECTRICAL CURRENTS

CROSS-REFERENCE TO PRIOR APPLICATIONS

This application is a U.S. National Phase application under 35 U.S.C. § 371 of International Application No. PCT/EP2017/056312, filed on Mar. 16, 2017, and claims benefit to German Patent Application No. DE 10 2016 106 415.7, filed on Apr. 7, 2016. The International Application was published in German on Oct. 12, 2017 as WO 2017/174326 under PCT Article 21(2).

FIELD

The invention relates to a switching apparatus for conducting and interrupting electrical currents, in particular a hybrid switching arrangement for conducting and interrupting high DC currents and low-frequency AC currents, and a switching device having such a switching apparatus.

BACKGROUND

German patent application DE 10 2013 114 259 A1 describes an advantageous variant of a hybrid switching arrangement in which the time of the current load of the power semiconductor is minimized to achieve the longest possible life expectancy and the smallest possible size, which is particularly important for power contactors in the current range of several hundred amperes. To minimize the load current flowing through the power semiconductor, the commutation time is detected via a current transformer, and the current flow through the semiconductor is only maintained until the mechanical, opening switch gap has reached sufficient electric strength. In this short time, the load current is artificially led to zero by the semiconductor via the activation thereof, such that after both the extinguishing contact and the isolation contact which is connected in series thereto open, a reliable electrical isolation is achieved. Nevertheless, under certain circumstances, this hybrid switching arrangement may still result in unwanted switch arcs. Even with hybrid switches for conducting and interrupting very high currents, with a mechanical switching arrangement in the form of a vacuum interrupter, as known from German patent application DE 10 2013 114 260 A1, for example, unwanted switch arcs can occur under certain circumstances.

SUMMARY

In an embodiment, the present invention provides a switching apparatus for conducting and interrupting electrical currents, comprising: a first mechanical contact arrangement; a semiconductor switch which is connected in parallel to the first mechanical contact arrangement; a second mechanical contact arrangement connected in series to the first mechanical contact arrangement; an auxiliary coil which is electrically isolated from a circuit of a switching drive used to move contacts of the first and second mechanical contact arrangements, and which is electromagnetically coupled to a coil of the switching drive such that a voltage is generated therein when a voltage supply of the switching drive is switched off; and a switching electronics configured to switch the semiconductor switch on and off, and which is supplied with the voltage generated in the auxiliary coil when the voltage supply of the switching drive is switched off, wherein the switching electronics is configured to switch the semiconductor switch on and off multiple times according to a prespecified sequence to interrupt electrical currents during an opening operation of the first and second mechanical contact arrangements.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
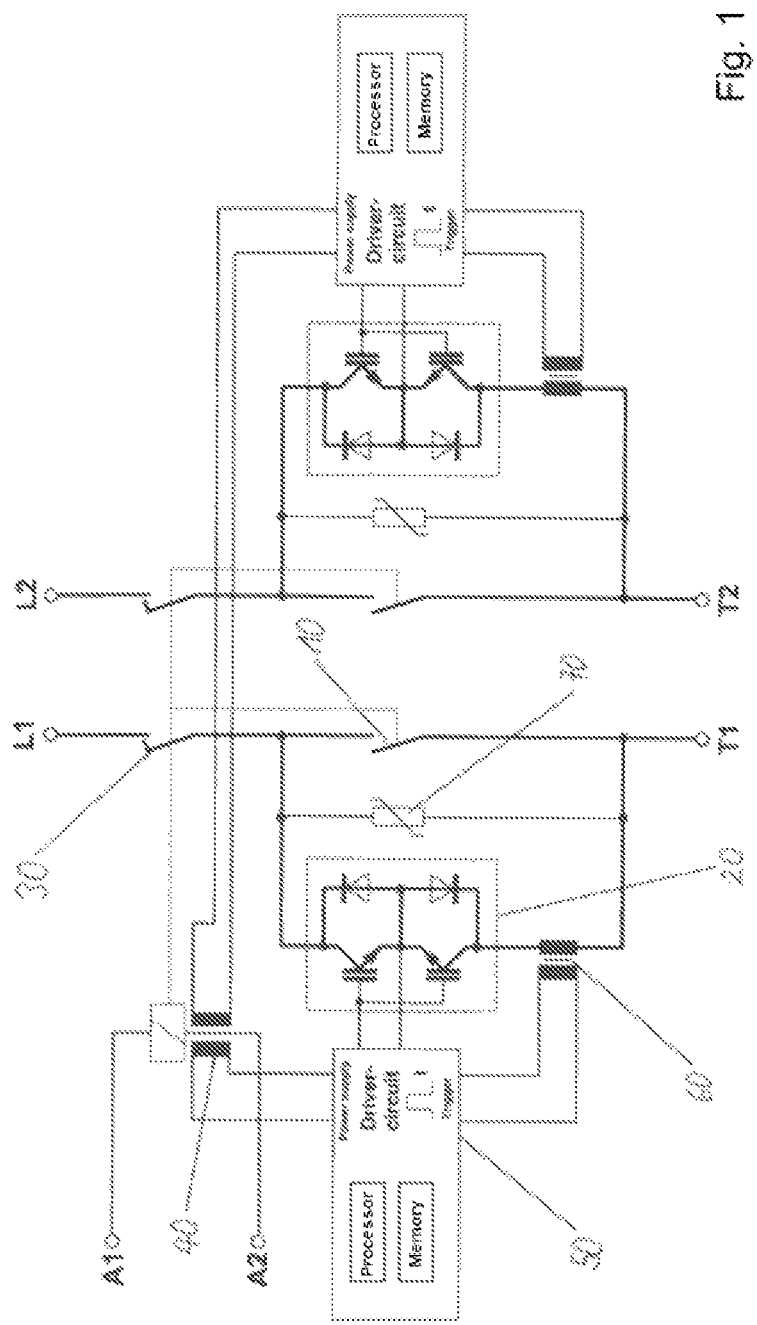
FIG. 1 shows a block diagram of an embodiment of a switching apparatus, having a double contact arrangement according to the invention.

In an embodiment, the present invention provides a switching apparatus for conducting and interrupting electric currents, in particular a hybrid switching arrangement for conducting and interrupting high DC currents and low-frequency AC currents, and a switching device having such a switching apparatus, wherein the risk of forming unwanted switch arcs is reduced, thereby achieving increased reliability and the highest possible electrical service life.

A more detailed investigation by the inventor into the causes of the unwanted switch arcs in the switching apparatuses described above and known from German patent applications DE 10 2013 114 259 A1 and DE 10 2013 114 260 A1, which have two series-connected mechanical contact arrangements and a semiconductor switch connected in parallel to one of the mechanical contact arrangements, has shown that the risk of switch arcs can be reduced by a targeted control-based modification of the switch-off procedure. Therefore, the present invention proposes designing a switching electronics, used for switching the semiconductor switch on and off, in such a manner that the electronics turns the semiconductor switch on and off multiple times according to a prespecified sequence to interrupt electrical currents during an opening operation of the first and second mechanical contact arrangements. By switching the semiconductor switch on at least twice, an unwanted switch arc, which is formed, for example after the first switching-on phase of the semiconductor switch by a re-contacting of the contacts of the mechanical contact arrangements, can be extinguished by commutation of its electrical current to the semiconductor switch.

An embodiment of the invention relates to a switching apparatus for conducting and interrupting electrical currents, having a first mechanical contact arrangement, a semiconductor switch connected in parallel to the first mechanical contact arrangement, a second mechanical contact arrangement connected in series to the first mechanical contact arrangement, an auxiliary coil which is electrically isolated from the circuit of a switching drive used to move contacts of the first and second mechanical contact arrangements and which is electromagnetically coupled to a coil of the switching drive in such a manner that a voltage is generated therein when the voltage supply of the switching drive is switched off, and a switching electronics designed for switching the semiconductor switch on and off, said electronics being supplied with the voltage generated in the auxiliary coil when the power supply of the switching drive is switched off. According to the invention, the switching electronics is designed to switch the semiconductor switch on and off multiple times in accordance with a prespecified sequence to interrupt electrical currents during an opening operation of the first and second mechanical contact arrangements.

In particular, the prespecified sequence may comprise the following temporally successive steps: first switching-on of the semiconductor switch as soon as the switching electronics is supplied with a voltage from the auxiliary coil, first switching-off of the semiconductor switch, second switching-on of the semiconductor switch after a prespecified switch-off time has expired, and second switching-off of the semiconductor switch after a prespecified current conduction time has expired.

A current transformer may also be provided for detecting the flow of current through the semiconductor switch and for generating a corresponding signal which is fed to the switching electronics, and the step of the first switching-off of the semiconductor switch may comprise the steps of: switching-off the semiconductor switch after a maximum activation time of the semiconductor switch has expired; switching off the semiconductor switch after expiry of a further, prespecified current conduction time after the signal has been received from the current transformer.

The further, prespecified current conduction time can be of such a duration that it corresponds approximately to a duration for the opening of the contacts of the first and second mechanical contact arrangements.

The prespecified current conduction time can be of such a duration that it corresponds approximately to a period of time before an electric current can commutate to the semiconductor switch due to an arc which may be formed between the opened contacts of the first and second mechanical contact arrangements during the opening operation.

In particular, the switching electronics can be configured to switch on the semiconductor switch for the second time after a time period of a duration such that the first and second mechanical contact arrangements are completely opened by the opening operation.

In addition, a further embodiment of the invention relates to a switching device having a switching apparatus according to the invention, as described herein, and a switching drive for moving contacts of the first and second mechanical contact arrangements. Such a switching device can, in particular, have a specially modified magnetic drive in which an auxiliary coil of a switching apparatus according to the invention is wound around the drive coil, supplying current to a switching electronics which activates a hybrid switch of the switching device.

Another embodiment of the invention relates to a method for controlling a semiconductor switch of a switching apparatus for conducting and interrupting electric currents, said apparatus comprising a first mechanical contact arrangement, the semiconductor switch connected in parallel to the first mechanical contact arrangement, and a second mechanical contact arrangement connected in series to the first mechanical contact arrangement, wherein, in the method, the semiconductor switch is switched on and off multiple times according to a prespecified sequence to interrupt electrical currents during an opening operation of the first and second mechanical contact arrangements.

According to the method, the prespecified sequence may include the following chronologically successive steps: first switching-on of the semiconductor switch as soon as the opening process is initiated, first switching-off of the semiconductor switch, second switching-on of the semiconductor switch after a prespecified switch-off time, and second switching-off of the semiconductor switch after expiry of a prespecified current conduction time.

The method can be carried out by a switching electronics designed for switching the semiconductor switch on and off. In particular, the switching electronics may be implemented by a processor and a memory in which a program is stored which configures the processor to carry out a method according to the invention as described herein.

Further advantages and possible applications of the present invention will become apparent from the following description in conjunction with the embodiments illustrated in the drawings.

The description, the claims, the abstract and the drawings use the terms and associated reference numbers in the list of reference numbers given below.

In the following description, identical, functionally-identical and functionally-connected elements may be provided with the same reference numbers. Absolute values are given below only by way of example and are not to be construed as limiting the invention.

FIG. 1 shows the block diagram of a switching apparatus according to the invention, for a 2-pole, polarity-independent switching device. The terminals of the switching device for the two poles are designated by L1, T1 and L2, T2, respectively. In terms of circuitry, this switching apparatus largely corresponds to the device described in German patent application DE 10 2013 114 259 A1 (shown in FIG. 1 therein). The inventive device described below differs from this known device in the switching electronics 50, which is designed for a specialized control of the semiconductor switch 20, as will be explained in detail in the following description. The switching electronics 50 may, for example, be implemented by a processor and a memory (in particular a microcontroller), wherein a program is stored in the memory which configures the processor to carry out the method steps which result in the specialized control by the processor of the semiconductor switch 20, as explained below by way of an example. The program may be part of the firmware of a processor-controlled switching device, for example.

For each pole, the switching apparatus shown in FIG. 1 has a parallel connection of a first mechanical (extinguishing) contact arrangement 10 and a semiconductor switch 20 based on an anti-serial IGBT arrangement (power semiconductor), which is connected in series to a second mechanical contact arrangement 30 to ensure electrical isolation. The mechanical contact arrangements 10 and 30 can be designed as a bridge switching arrangement of an air switch device and/or —arrangement.

The semiconductor switch 20 is switched on or off—that is, connected or interrupted—by the switching electronics 50. The switching electronics 50 is powered by energy stored in the (magnetic drive) coil of the switching and/or magnetic drive of the switching device. For this purpose, an auxiliary coil 40 is provided. The same is electrically isolated from the circuit of the switching drive and can generate a voltage to supply current to the switching electronics 50 when the switching drive is switched off. The auxiliary coil 40 may, for example, be wound around the drive coil.

When switched on—that is, when the switching drive is supplying voltage and current to the magnetic drive coil and the contacts of the first and second mechanical contact arrangements 10 and 30 are closed—the semiconductor switch 20 is disabled. This is because, when the auxiliary coil 40 is in this state, no voltage is generated to supply current to the switching electronics 50, and the switching electronics 50 is therefore de-energized and cannot control the IGBTs of the semiconductor switch 20.

At the moment when the voltage and power supply to the magnetic drive coil of the switching drive is switched off, to open the contacts of the first and second mechanical contact arrangements 10 and 30, the energy stored in the magnetic drive coil generates a flyback voltage which, in turn, induces a voltage in the auxiliary coil 40 coupled electromagnetically to the magnetic drive coil, activating the switching electronics 50.

The voltage induced in the auxiliary coil 40 is sufficient to power the switching electronics 50 itself and also to build up the voltage required to activate the IGBTs. The auxiliary coil 40 has the advantage that the semiconductor switch can be activated before the opening of the contacts of the first and second mechanical contact arrangements 10 and 30, respectively.

In switching apparatuses with an electromechanical magnetic drive, the duration of time from the initiation of the switching-off operation and the opening of the mechanical contacts is usually several milliseconds (ms), typically approx. 10 ms. During this period, the threshold of the IGBT activation voltage (typically in the range from 6-7 V) is exceeded by the voltage induced in the auxiliary coil 40, such that the switching electronics 50 can connect same through to the IGBTs of the semiconductor switch 20. As a result, the IGBTs are switched to low impedance (that is, the semiconductor switch 20 is switched on) and the load current to be connected is immediately commutated to the semiconductor switch 20 upon the opening of the (extinguishing) contacts of the first mechanical contact arrangement 10.

As a result of the activation of the IGBTs, which proceeds in advance, typically no arc is formed between the opening extinguishing contacts of the first mechanical contact arrangement 10.

The isolation contacts of the second mechanical contact arrangement 30 do not open simultaneously with the extinguishing contacts of the first mechanical contact arrangement 10. Rather, the isolation contacts should open with a defined time delay relative to the extinguishing contacts. This can be accomplished, for example, by a corresponding mechanical configuration of the two mechanical contact arrangements 10 and 30.

Ideally, the delayed opening of the two mechanical contact arrangements 10 and 30 occurs at an interval which is greater than the time of current flow through the semiconductor switch 20. This makes it possible to prevent the formation of a switch arc between the contacts. In practice, this time-delayed opening of the contacts is not achievable, or is achievable only with great effort, such that a switch arc burns for a short time across the contacts until the extinction of the current flowing through the semiconductor switch.

As was discovered in an investigation by the inventors, with frequent switching of DC currents, in particular with the same polarity, the topography of the contact surface can gradually change as a result of this recurring arc loading in an air switch device such as that described above, primarily in a manner which results in a material migration involving continuously changing contact surfaces due to the known, significantly different mobilities, and the kinetic energy of cations and anions, in the switch gap.

Figure 2A:
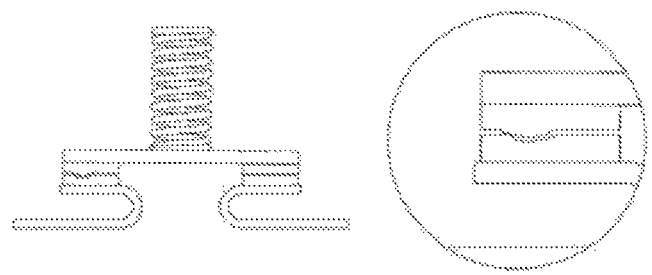
FIGS. 2a-2c show an exemplary sequence of movements for the opening of the contacts of a double contact arrangement.
Figure 2B:
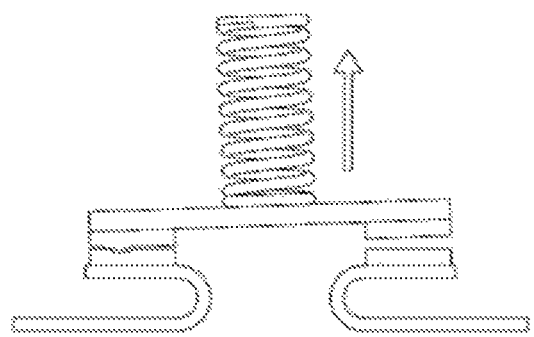
Figure 2C:
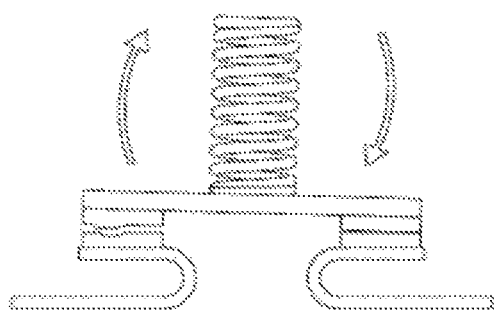

When DC currents in the range of several hundred amperes are connected, at high switching operation rates, such contact surfaces tend toward mostly slight, dot-shaped welds (often also referred to as "Verpappungen" in German). In this case, during the switching-off operation, the extinguishing contacts can first open slightly, while the isolation contacts are still closed due to the weld formation. This routinely leads to commutation of the load current to the connected power semiconductor, whereby same is led to zero after a short time. Upon further opening of the switching bridge, the welding of the isolation contacts is then typically broken by the switching drive. In this case, the action of the contact spring can lead to a tilting movement of the switching bridge, which may produce a brief re-contacting due to the still-narrow contact gap. Such a series of movements in a switching bridge is shown schematically in FIGS. 2a-2c (FIG. 2a: closed DC contact bridge with one-sided welding due to advanced migration of material; FIG. 2b: start of the contact opening with one-sided welding; FIG. 2c: re-contacting after the contact welding is broken). Continuing the contact opening process can then lead to the formation of arcs. Since, after completion of the immediately-preceding extinction process, the power semiconductor is no longer connected, there is no repeated commutation to the semiconductor after the described re-contacting upon the second, final opening of the extinguishing contacts. As a result, in such cases, a permanent DC arc may form undesirably upon the final opening of the extinguishing contacts, leading to the destruction of the switching device.

Figure 3:
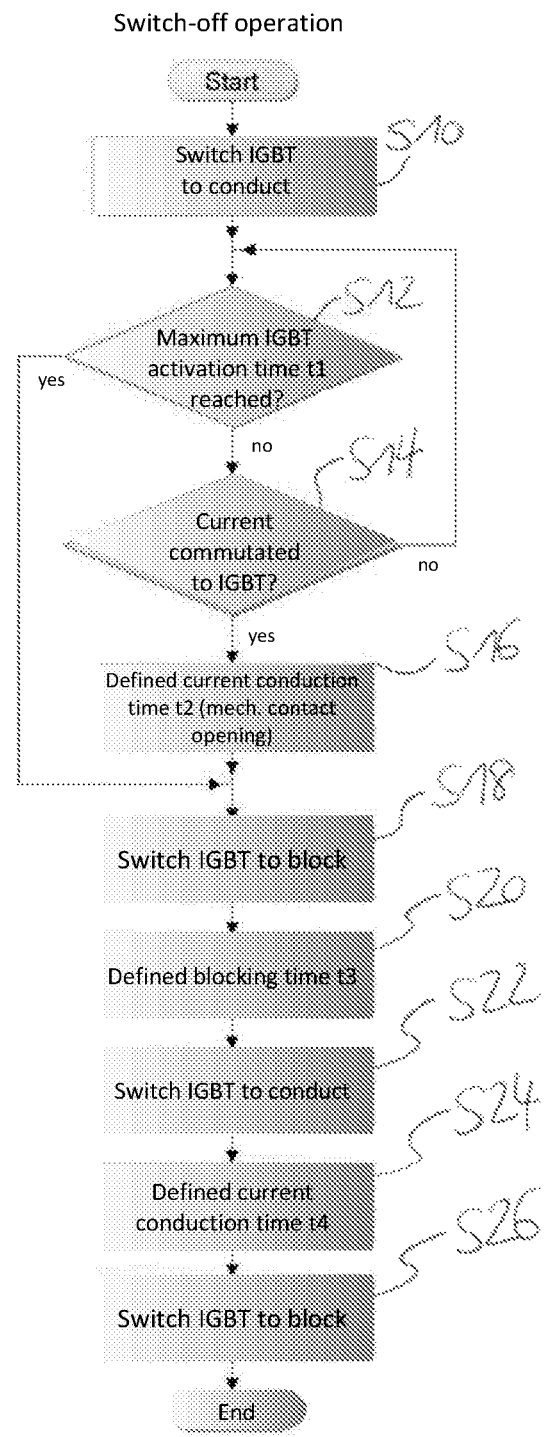
FIG. 3 shows a flow chart of the control of a semiconductor switch by a switching electronics of a switching apparatus according to the invention.

In the vacuum switching arrangement for conducting and interrupting very high currents, shown in FIG. 3 in German patent application DE 10 2013 114 260 A1, having two separate vacuum chambers with independent contact arrangements which are designed electronically as a series circuit and combined into a single structure, unwanted arcing can occur under certain conditions, as revealed by an investigation by the inventors.

According to the operating principle of this double contact switch, in the switch-off operation, first one of the two pairs of contacts opens due to the opening movement of the movable electrode, which is mechanically fixed to the switching drive. As in the case of the bridge switching arrangement described above, a commutation of the load current back to a parallel-connected power semiconductor occurs at the moment of the contact opening, wherein the load current is led to zero in a short time in said power semiconductor. Then the electrical isolation in the hybrid switch is ensured via the second contact pair, which preferably opens with a slight time delay. This pair of isolation contacts opens in such a manner that a tensile force is exerted on the vacuum switching tube via the movable electrode (which opens first), thereby moving said tube in the direction of the pulling electrode until it reaches a mechanical stop. Because the second movable electrode is fixed to the housing of the hybrid switch, the movement of the vacuum tube results in the opening of the second contact pair. When the stop is reached, the desired isolating distance between the two contacts is reached.

When the movable electrode of the extinguishing contact arrangement reaches its end position in the switching device, a rebound often occurs due to the inertia of the moved switching arrangement. Because, in low-voltage switching devices, the contact opening distances of vacuum interrupters are usually only 1-2 mm, in unfavorable cases, the rebound movement can lead to a brief re-contacting of the extinguishing contacts. If the power semiconductor is no longer connected through at this moment, the subsequent, final opening of the extinguishing contacts can lead to the formation of a permanent vacuum arc, which leads to the destruction of the switching device as described in the first case.

In order to reduce the risk of this unwanted arc formation, in particular by re-contacting (for example, due to tilting movements of a switching bridge or due to rebounds), the switching electronics 50 is designed according to the invention in such a manner that it switches the semiconductor switch 20 on and off multiple times according to a prespecified sequence during an opening operation of the mechanical contact arrangements 10, 30. By at least one more switching-on of the semiconductor switch 20, an unwanted arc, in particular caused by re-contacting after the opening of the contacts has occurred, can be extinguished by commutation of its electrical current to the IGBTs of the connected semiconductor switch 20 (the IGBTs are switched to low impedance).

The prespecified sequence for switching the semiconductor switch 20 on and off can be implemented in various ways, as explained below.

In principle, it is possible for the switching electronics to implement a fixed, prespecified sequence of switching on and off, in which the various switch-on and switch-off phases (and/or current conduction and switch-off times of the semiconductor switch 20 or its IGBTs) can be adapted to the mechanical parameters of the contact arrangement of the respective switching apparatus, and in which electronic parameters such as the current carrying capacity of the semiconductor switch 20 can be taken into account.

An exemplary, prespecified sequence may include the following temporally successive steps which are performed by the switching electronics 50 in order to accordingly control the semiconductor switch 20 (with reference to the flowchart shown in FIG. 3 of an exemplary control of the semiconductor switch 20 by the switching electronics 50):

By means of the voltage induced in the auxiliary coil 40 electromagnetically coupled to the magnetic drive coil, when the voltage and power supply of the magnetic drive coil of the switching drive are switched off to open the contacts of the first and second mechanical contact arrangements 10 and 30, the switching electronics 50 is activated and builds up the voltage required to activate the IGBTs, such that the IGBTs of the semiconductor switch 20 are switched to low impedance (i.e., the semiconductor switch 20 is switched on=first switching-on of the semiconductor switch, step S10), which results in a commutation of the load current to be switched to the semiconductor switch 20 upon the opening of the (extinguishing) contacts of the first mechanical contact arrangement 10.

Subsequently, the switching electronics 50 switches the semiconductor switch 20 off again (step S18) by reducing the voltage required to activate the IGBTs to such an extent that the IGBTs of the semiconductor switch 20 are switched to high impedance—that is, are blocked for any significant flow of current. Typically, this switching-off occurs after a period of time of a duration which corresponds to the current carrying capacity of the IGBTs (the maximum activation time of the semiconductor switch 20) (step S12) and/or the time required to fully open the contacts.

After a prespecified switch-off time has elapsed (step S20), the switching electronics 50 switches on the semiconductor switch 20 again (step S22) by increasing the voltage required to drive the IGBTs to such an extent that the IGBTs of the semiconductor switch 20 are again switched to low impedance. As a result, a current that might flow via an arc between contacts can commutate to the IGBTs of the semiconductor switch 20, such that the arc is extinguished.

After a prespecified current conduction time (step S24), the switching electronics 50 switches the semiconductor switch 50 off again (step S26) by again reducing the voltage required to activate the IGBTs, to such an extent that the IGBTs of the semiconductor switch 20 are switched to high impedance and block current flow. At this point, the semiconductor switch 20 can remain permanently switched off until the contacts are actuated again. However, in principle, further switching-on and switching-off operations can be initiated by the switching electronics 50, depending on the requirements of the switching apparatus, in particular the mechanical contact apparatus thereof and the risk of the formation of arcs.

With regard to the longest possible electrical service life of the IGBTs, and their reasonably large dimensions, it is expedient to limit the duration of current flow through the semiconductor switch 20 in such a way that the current only flows therethrough until the mechanical switch gap reaches a sufficient electric strength once again. For the minimization of the current flow time through the semiconductor switch 20, exact knowledge of the commutation time point is important, since the effective times for the mechanical switch-off operation for each switching apparatus vary for different reasons.

The time point of the commutation to the already-connected IGBT of the semiconductor switch 20 can be detected by a current transformer 60 therein. The current transformer 60 generates a signal as soon as a current begins to flow through the IGBTs of the semiconductor switch 20, i.e. the flow of current commutates from the first mechanical contact arrangement 10 to the semiconductor switch 20 (step S14). The signal generated by the current transformer 60, signaling the commutation, is relayed to the switching electronics 50, which can accordingly control the semiconductor switch 20 as described below.

Immediately after the commutation has occurred, the switching electronics 50 can control the semiconductor switch 20 in such a manner that the IGBTs of the semiconductor switch 20 resume blocking (step S18) after a short current flow time and/or current conduction time which is defined and/or prespecified via the control electronics (step S16), such that the commutated load current in the semiconductor switch 20 is led to zero within the defined period of time. The current flow time in this case can be set via the switching electronics 50 in such a manner that, if a short-duration switch arc occurs at the isolation contacts after it is extinguished, there is sufficient time for the switch gap to recover its electric strength. This is especially important in the case of air switch gaps for high currents. If vacuum interrupters are used for the mechanical isolation, comparably short times for electric strength recovery can be achieved, which is advantageous for minimizing the current flow time in the IGBTs.

Equipping the semiconductor switch 20 with an anti-serial IGBT enables the use of such a switching arrangement both for DC currents with any current flow direction, as well as AC voltages of different frequencies, wherein the switching time point is not phase angle-dependent, due to the independent power supply to the control module.

During the switch-off operation in the semiconductor switch 20, high currents lead to high dI/dt values, as a result of which voltage spikes significantly above 1 kV can occur. To protect against such voltage spikes, it is expedient to connect a protective element, for example, in the form of a varistor 70, in front of, or in parallel to, the semiconductor switch 20.

When the zero-current state is reached, the semiconductor switch 20 becomes stably blocking. At the same time, a reliable electrical isolation is produced in the hybrid switch by the now-open isolation contacts 30.

If provision is made, via a suitable mechanical coupling or by electronic means, for the extinguishing contacts of the first mechanical contact arrangement 20 to precede the isolation contacts of the second mechanical contact arrangement 30 by the amount of time in which the semiconductor switch 20 is conducting, it is possible for both mechanical contact arrangements 10 and 30 to be essentially completely free of arcs—which is of corresponding advantage for the life expectancy of the switching apparatus, and in particular of the hybrid switch.

The present invention is particularly suitable for use in contactors, circuit breakers and motor protection switches which are designed in particular for operation with direct currents and/or low-frequency currents. It enables the switching of high DC currents and low-frequency currents with a comparatively high electrical service life, since long arc burn times, as well as a long current load of the semiconductor switch, can be avoided. Furthermore, these properties allow the realization of relatively compact switching devices for high currents.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A switching apparatus for conducting and interrupting electrical currents, comprising:
    a first mechanical contact arrangement;
    a semiconductor switch which is connected in parallel to the first mechanical contact arrangement;
    a second mechanical contact arrangement connected in series to the first mechanical contact arrangement;
    an auxiliary coil which is electrically isolated from a circuit of a switching drive used to move contacts of the first and second mechanical contact arrangements, and which is electromagnetically coupled to a coil connected to the switching drive such that a voltage is generated therein when a voltage supply of the switching drive is switched off; and
    a switching electronics configured to switch the semiconductor switch on and off, and which is supplied with the voltage generated in the auxiliary coil when the voltage supply of the switching drive is switched off,
    wherein the switching electronics is configured to switch the semiconductor switch on and off multiple times according to a prespecified sequence to interrupt electrical currents during an opening operation of the first and second mechanical contact arrangements.

2. The switching apparatus according to claim 1, wherein the prespecified sequence has the following temporally successive steps:
    first switching-on of the semiconductor switch as soon as the switching electronics is supplied with a voltage from the auxiliary coil;
    first switching-off of the semiconductor switch;
    second switching-on of the semiconductor switch after a prespecified switch-off time has expired; and
    second switching-off of the semiconductor switch after a prespecified current conducting time has expired.

3. The switching apparatus according to claim 2, further comprising a current transformer configured to detect a flow of current through the semiconductor switch, and to generate a corresponding signal which is fed to the switching electronics, and
    wherein the step of the first switching-off of the semiconductor switch comprises the following steps:
        switching-off of the semiconductor switch after a maximum activation time of the semiconductor switch has expired; and
        switching-off of the semiconductor switch after expiry of a further, prespecified current conduction time after the signal has been received from the current transformer.

4. The switching apparatus according to claim 3, wherein the further, prespecified current conducting time is of a duration that corresponds approximately to a duration for the opening of the contacts of the first and second mechanical contact arrangements.

5. The switching apparatus according to claim 2, wherein the prespecified current conduction time is of a duration that corresponds approximately to a period of time before an electric current can commute to the semiconductor switch due to an arc which may be formed between the opened contacts of the first and second mechanical contact arrangements during the opening operation.

6. The switching apparatus according to claim 1, wherein the switching electronics is configured to switch on the semiconductor switch for the second time after a time period of a duration such that the first and second mechanical contact arrangements are completely opened by the opening operation.

7. A switching device, comprising:
    the switching apparatus according to claim 1; and
    a switching drive configured to move contacts of the first and second mechanical contact arrangements.

8. A method for controlling a semiconductor switch of a switching apparatus for conducting and interrupting electrical currents, comprising a first mechanical contact arrangement, the semiconductor switch being connected in parallel to the first mechanical contact arrangement, and a second mechanical contact arrangement connected in series to the first mechanical contact arrangement, the method comprising:
- switching on and off the semiconductor switch multiple times according to a prespecified sequence to interrupt electrical currents during an opening operation of the first and second mechanical contact arrangements,
- wherein the prespecified sequence has the following temporally successive steps:
  - first switching-on of the semiconductor switch as soon as the opening operation is initiated;
  - first switching-off of the semiconductor switch; and
  - second switching-on of the semiconductor switch after a prespecified switch-off time has expired.

9. The method according to claim 8, wherein the prespecified sequence further includes, after the
- second switching-on of the semiconductor switch after the prespecified switch-off time has expired:
- second switching-off of the semiconductor switch after a prespecified current conducting time has expired.

10. The method according to claim 8, wherein the method is implemented by a switching electronics configured to switch the semiconductor switch on and off, the switching electronics comprising a processor and a memory in which a program is stored which configures the processor to carry out the method.

\* \* \* \* \*